United States Patent
Tang et al.

(10) Patent No.: US 12,432,891 B2
(45) Date of Patent: Sep. 30, 2025

(54) REVERSIBLE COOLING APPARATUS FOR SYSTEMS WITH VARIABLE HEAT DISTRIBUTION

(71) Applicant: L3Harris Technologies, Inc., Melbourne, FL (US)

(72) Inventors: Lixin Tang, Irvine, CA (US); Michael Kelleghan, Huntington Beach, CA (US)

(73) Assignee: L3Harris Technologies, Inc., Melbourne, FL (US)

( * ) Notice: Subject to any disclaimer, the term of this patent is extended or adjusted under 35 U.S.C. 154(b) by 224 days.

(21) Appl. No.: 18/475,642

(22) Filed: Sep. 27, 2023

(65) Prior Publication Data

US 2025/0107052 A1    Mar. 27, 2025

(51) Int. Cl.
    *H05K 7/20* (2006.01)
    *H02M 3/158* (2006.01)

(52) U.S. Cl.
    CPC ...... *H05K 7/20927* (2013.01); *H02M 3/1582* (2013.01); *H05K 7/20945* (2013.01)

(58) Field of Classification Search
    CPC .......... H05K 7/20927; H05K 7/20945; H02M 3/1582; H02M 3/003; H02M 1/327
    See application file for complete search history.

(56) References Cited

U.S. PATENT DOCUMENTS

| | | | |
|---|---|---|---|
| 11,019,755 B2 | 5/2021 | Campbell et al. | |
| 11,483,947 B2 | 10/2022 | Whitmore et al. | |
| 11,548,349 B2* | 1/2023 | Li | B60H 1/3208 |
| 2012/0327602 A1* | 12/2012 | Kulkarni | H05K 7/14325 361/700 |

* cited by examiner

*Primary Examiner* — Adolf D Berhane
*Assistant Examiner* — Afework S Demisse
(74) *Attorney, Agent, or Firm* — Edell, Shapiro & Finnan, LLC

(57) ABSTRACT

An apparatus comprising: a first circuit and a second circuit of a circuit configured to operate in a first mode and a second mode in which the first circuit dissipates more power than the second circuit and the second circuit dissipates more power than the first circuit, respectively; a coolant conduit with a first port and a second port and along which the first circuit and the second circuit are located nearer the first port and the second port, respectively; and a conduit switch network configured to deliver colder coolant to the first port or the second port, depending on which mode is active, such that the colder coolant flows through the coolant conduit and initially encounters whichever of the first circuit and the second circuit dissipates more power, then encounters whichever of the first circuit and the second circuit is not dissipating more power.

20 Claims, 8 Drawing Sheets

| OPERATING MODE<br>FLUID SWITCHES / VALVES | BUCK | BOOST | TRANSITION |
|---|---|---|---|
| $K1_{IN}$ | ON | OFF | ON |
| $K1_{OUT}$ | ON | OFF | ON |
| $K2_{IN}$ | OFF | ON | ON |
| $K2_{OUT}$ | OFF | ON | ON |

FIG.6

REVERSIBLE COOLING APPARATUS FOR SYSTEMS WITH VARIABLE HEAT DISTRIBUTION

TECHNICAL FIELD

The present disclosure relates to power circuit cooling systems.

BACKGROUND

A direct current (DC)-to-DC (DC-DC) converter includes switching transistors that may be controlled to operate in either a Buck mode or a Boost mode. The DC-DC converter can alternate/switch between the two modes. When the DC-DC converter operates in the different modes, the switching transistors experience imbalanced power dissipation across the different modes. For example, when the Buck mode is active, a first switching transistor experiences more power loss (i.e., dissipates more power) and runs at a higher temperature (i.e., runs hotter) than a second switching transistor. Conversely, when the Boost mode is active, the second switching transistor dissipates more power and thus runs hotter than first switching transistor. A conventional cooling system applies equivalent cooling to the first and second switching transistors that dissipate the unequal power. This results in a higher junction temperature of the first or second switching transistor depending on which mode is active, in which case the cooling becomes a bottleneck for the DC-DC converter, limiting its maximum power and power density.

BRIEF DESCRIPTION OF THE DRAWINGS

FIG. 6 is an example table that summarizes operating modes of the power circuit and states of valves of the conduit switch network, according to an embodiment.

DESCRIPTION OF EXAMPLE EMBODIMENTS

Overview

In an embodiment, an apparatus comprises: a first circuit and a second circuit of a circuit configured to operate in a first mode and a second mode in which the first circuit dissipates more power than the second circuit and the second circuit dissipates more power than the first circuit, respectively; a coolant conduit along which the first circuit and the second circuit are thermally coupled at spaced-apart locations; and a conduit switch network to deliver cold coolant to the coolant conduit to cool the circuit, depending on which mode is active, such that the cold coolant flows through the coolant conduit and initially encounters whichever of the first circuit and the second circuit dissipates more power, then encounters whichever of the first circuit and the second circuit is not dissipating more power.

Example Embodiments

Figure 1:
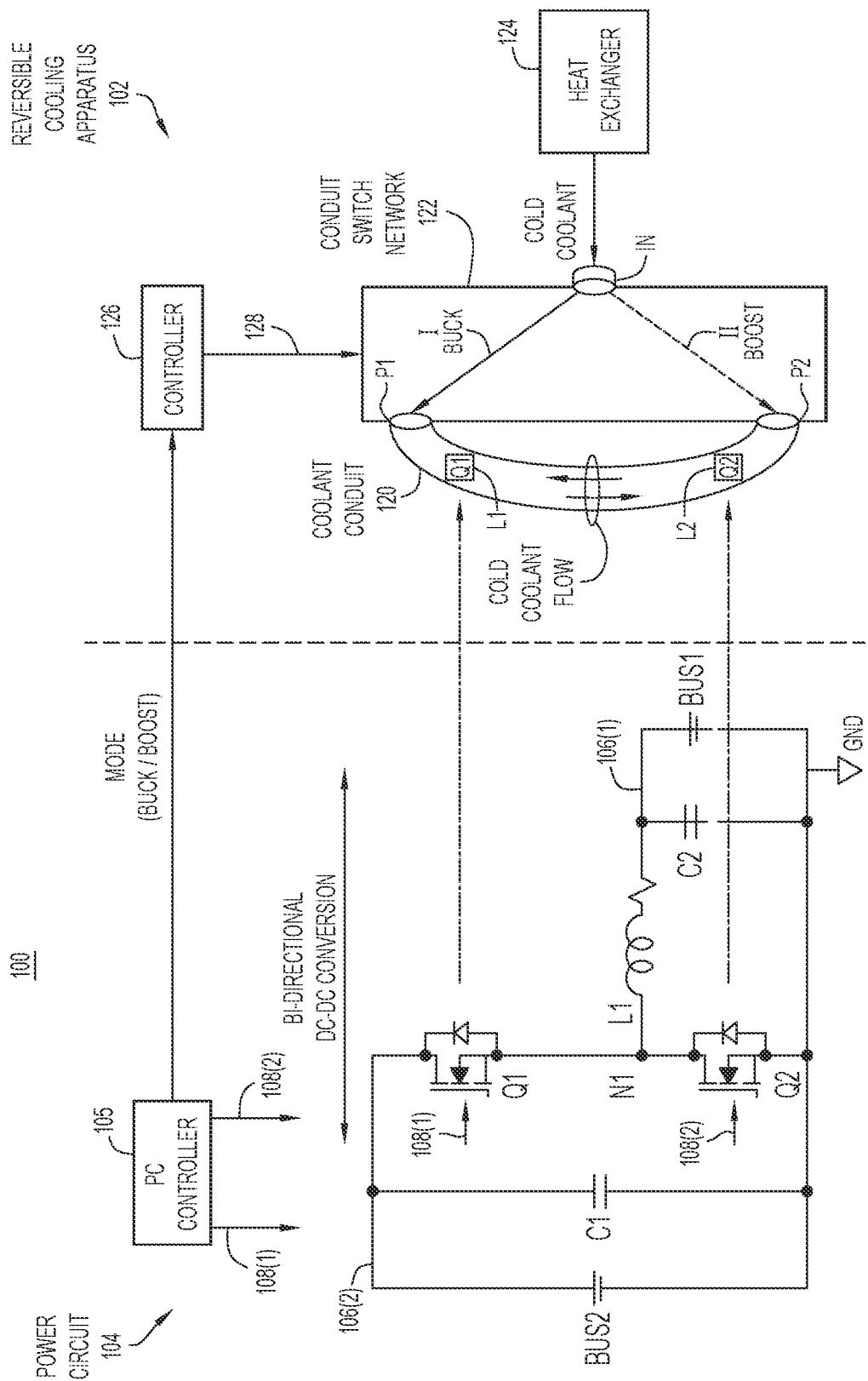
FIG. 1 is a block diagram of a system in which an example reversible cooling apparatus is used to fluid cool an example power circuit coupled to the reversible cooling apparatus.

FIG. 1 is a combined circuit and coolant flow diagram of a system 100 in which an example reversible cooling apparatus 102 is used to fluid/liquid cool an example power circuit 104 coupled to the reversible cooling apparatus. Power circuit 104 includes a non-isolated bi-directional DC-DC converter, which may be used in a range of power systems, including maritime power systems, as an interface between different DC power nets, and which may be used for impedance control of different power stages, for example. Power circuit 104 operates in a first direction to generate a DC voltage Bus1 across a voltage rail 106(1) and ground (GND) based on a DC voltage Bus2 that is applied across a voltage rail 106(2) and ground. Power circuit 104 also operates in a reverse direction to generate Bus1 from Bus2. Power circuit 104 is considered non-isolated because the opposing ends of the power circuit (e.g., Bus1 and Bus2) are not isolated. In the example of FIG. 1, power circuit 104 is configured as a Buck or Boost converter, which may operate selectively in different modes, including a Boost converter mode (i.e., Boost mode) or a Buck converter mode (i.e., Buck mode).

Power circuit 104 includes a top (T) or first switching transistor Q1 (referred to as "Q1") and a second or bottom (B) switching transistor Q2 both operated under control of a power circuit (PC) controller 105. Q1 has a source-drain path connected to voltage rail 106(2) and an intermediate node N1, and a gate to receive a switching signal 108(1) generated by PC controller 105 to alternately turn on (i.e., switch on) and turn off (i.e., switch off) the source-drain current path. Q2 has a source-drain path connected to ground and to intermediate node N1 such that the source-drain paths of Q1 and Q2 are connected in series between voltage rail 106(2) and ground, and a gate to receive a switching signal 108(2) generated by PC controller 105 to turn on and turn off Q2. Q1, Q2 may each be a Silicon (Si) Carbide (C) (SiC) MOSFET or other type of transistor. In an example, switching signals 108(1), 108(2) may comprise pulse width modulation (PWM) signals. The configuration of switching signals 108(1) and 108(2) (e.g., switching frequency, pulse width, phase, and so on) determines whether power circuit 104 operates in the Buck mode or the Boost mode. Power circuit 104 includes a capacitor C1 coupled to and across voltage rail 106(2) and ground. Power circuit 104 also includes an inductor L1 coupled to node N1 and a node N2, and a capacitor C2 coupled to node N2 and ground.

PC controller 105 generates and configures switching signals 108(1) and 108(2) to control whether the power circuit operates in/implements the Buck mode or the Boost mode. In other words, PC controller 105 sets the operating mode of power circuit 104 to the Buck mode or the Boost mode through switching signals 108(1) and 108(2). In the Boost mode (i.e., when the Boost mode is active), power circuit 104 boosts an input voltage to produce an output voltage. Conversely, in the Buck mode (i.e., when the Buck mode is active), power circuit 104 reduces the input voltage to produce the output voltage.

When power circuit 104 operates in the different modes, switches Q1, Q2 have imbalanced power dissipation across the different modes. For example, when the Buck mode is active, Q1 experiences more power loss (i.e., dissipates more power). Conversely, when the Boost mode is active, Q2 dissipates more power. Were equivalent cooling to be applied to Q1 and Q2 in both modes, the unequal power dissipation would result in a higher junction temperature of Q1 or Q2 depending on the mode, in which case cooling becomes a bottleneck for power circuit 104, limiting the maximum power and power density.

Accordingly, reversible cooling apparatus 102 employs dynamically controlled liquid cooling to more effectively cool Q1 and Q2 across the different modes, automatically. As shown in FIG. 1, reversible cooling apparatus 102 includes a coolant conduit 120, a conduit switch network 122 (also referred to as a "coolant flow control network") in fluid communication with the coolant conduit, a heat exchanger 124 (more generally, any coolant source) to supply a cold coolant to an inlet IN (which is an inlet port) of the conduit switch network, and a controller 126 to control the conduit switch network. Controller 126 communicates with PC controller 105 to learn whether the Buck mode or the Boost mode is active (i.e., to learn the "active mode"), and generates control signals 128 to control a configuration of conduit switch network 122 based on the active mode. Coolant conduit 120 includes a port P1 (also referred to as a "top port") and a port P2 (also referred to as a "bottom port") at opposing ends of the coolant loop. Q1 and Q2 are thermally coupled to spaced-apart locations L1 and L2 along the coolant loop nearest to first port P1 and second port P2 (along a flow path of the cold coolant), respectively, as shown. As used herein, the term "port" refers to an opening for fluid egress and/or ingress, and "conduit" refers to a channel, tube, or the like, for conveying coolant in fluid form. In the example of FIG. 1, PC controller 105 and controller 126 are shown as separate entities by way of example, only. In other arrangements, the controllers may be combined into a single controller.

Depending on the active mode, controller 126 controls conduit switch network 122 to deliver the cold coolant arriving at inlet IN to a selected port of port P1, P2 that is nearest to whichever of Q1, Q2 dissipates more power for the active mode, such that when the cold coolant flows through coolant conduit 120, the cold coolant encounters whichever of Q1, Q2 dissipates more power first and encounters the alterative one of Q1, Q2 that dissipates less power second. While flowing along coolant conduit 120 from the selected port of ports P1 and P2 to the alternative port of ports P1, P2 in a direction of coolant flow, the cold coolant gradually warms and thus transitions to a "hot coolant" and exits the alternative port to return to heat exchanger 124 to be cooled (the return path is not shown in FIG. 1). When the active mode switches, controller 126 controls conduit switch network 122 to switch the selected port, which reverses the direction of coolant flow through coolant conduit 120. The example of FIG. 1 shows alternative/reversed fluid switch positions I and II of conduit switch network 122 when the Buck mode is active (solid-lined arrow) and the Boost mode is active (dashed-lined arrow).

Figure 2:
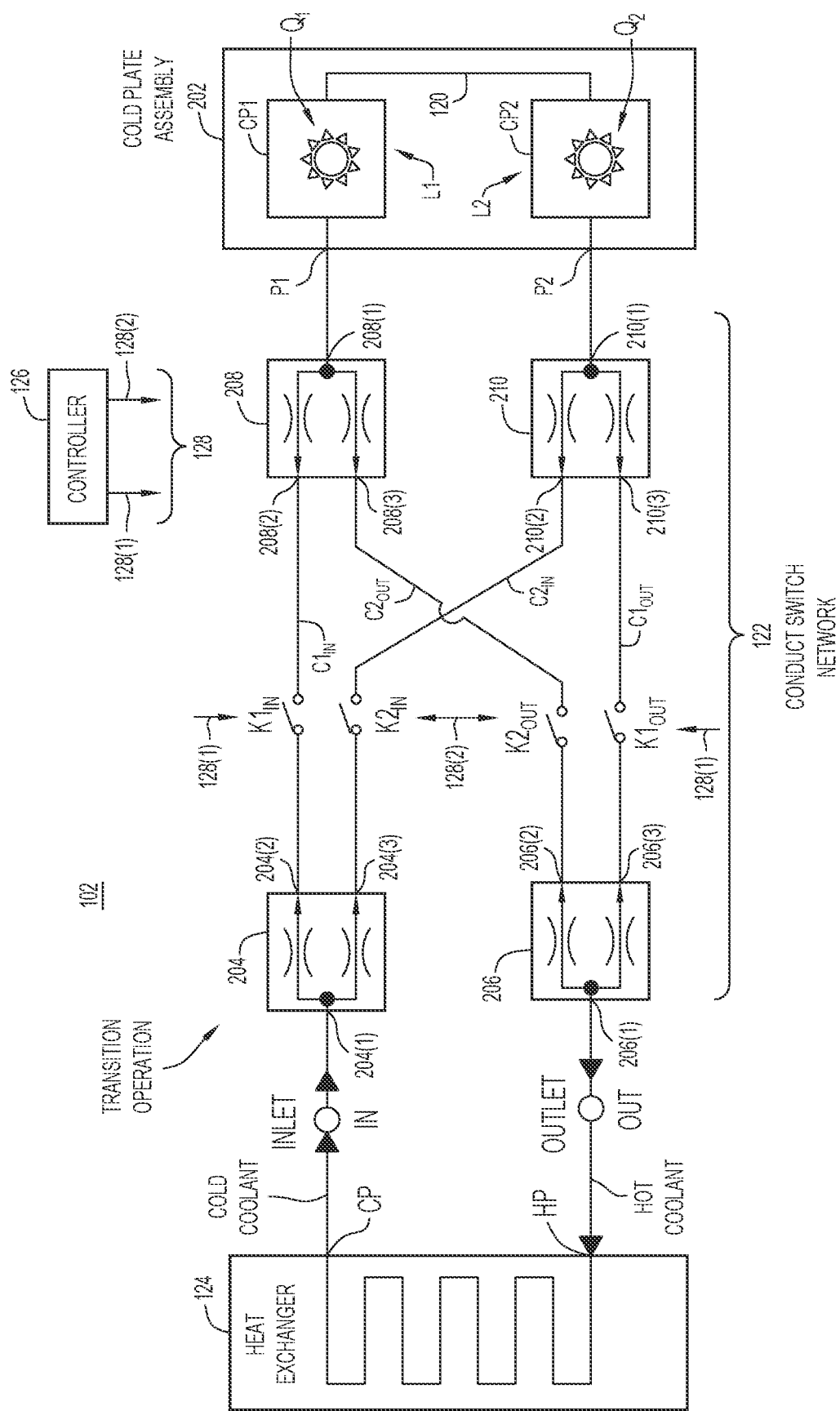
FIG. 2 is a block diagram of the reversible cooling apparatus according to an embodiment.

FIG. 2 is a diagram of reversible cooling apparatus 102 according to an embodiment. As shown in FIG. 2, reversible cooling apparatus 102 includes a cold plate assembly (ASSY) 202 in which coolant conduit 120 is disposed, conduit switch network 122, heat exchanger 124, and controller 126. Heat exchanger 124 includes a hot port HP and a cold port CP. Heat exchanger 124 receives the hot coolant at a temperature T1 at hot port HP from conduit switch network 122, coverts or cools the hot coolant to produce the cold coolant at a temperature T2<<T1, and supplies the cold coolant to the conduit switch network through cold port CP.

Cold plate assembly 202 may generally comprise a block of aluminum or other thermally conductive material, and defines coolant conduit 120 as an internal channel that extends through and along a length of the cold plate assembly. Cold plate assembly 202 has spaced-apart opposing ends including an end 206(1) (e.g., a first or top end) and an end 206(2) (e.g., a second or bottom end). Cold plate assembly 202 defines ports including port P1 and port P2 that are spaced-apart from each other and located nearest to ends 206(1) and 206(2) respectively. Coolant conduit 120 extends from port P1 to port P2 and is in fluid communication with the ports. Cold plate assembly 202 includes a cold plate CP1 (also referred to as a "cold cell") and a cold plate CP2 which are sections of the top surface of cold plate assembly 202 used to cool heat dissipating components and are spaced-apart from each other such that cold plate CP1 is nearest to port P1 and cold plate CP2 is nearest to port P2. Coolant conduit 120 extends beneath cold plates CP1 and CP2 and is thermal contact with the cold plates.

In the example of FIG. 2, Q1, Q2 are respectively mounted or fixed to cold plates CP1, CP2 so as to be in thermal contact with the cold plates, such that Q1, Q2 may be fluid cooled by coolant flowing through coolant conduit 120, as described previously and further below. In the example of FIG. 2, two stars on cold plate CP1 and a single star on cold plate CP2 denote that Q1 on cold plate CP1 dissipates more power than Q2 on cold plate CP2. Cold coolant flowing into port P1 traverses coolant conduit 120 in a first direction and exits port P2 as the hot coolant. Conversely, cold coolant flowing into port P2 traverses coolant conduit 120 in a second direction that is the reverse of the first direction and exits port P1 as the hot coolant.

Conduit switch network 122 includes inlet IN and an outlet OUT (which is an outlet port) respectively coupled to cold port CP and hot port HP of heat exchanger 124. Conduit switch network 122 is also coupled to port P1 and port P2 of cold plate assembly 202 (and of coolant conduit 120). Conduit switch network 122 further includes a network of "valved" conduits $C1_{IN}$, $C1_{OUT}$, $C2_{IN}$, $C2_{OUT}$ (collectively referred to as "conduits C") connected between inlet IN, outlet OUT, port P1, and port P2 and configured to selectively connect inlet IN and outlet OUT to port P1 and port P2 through controllable fluid switches or valves $K1_{IN}$, $K1_{OUT}$, $K2_{IN}$, $K2_{OUT}$ (collectively referred to as "valves K") coupled to respective ones of the conduits. Valves K may be solenoid actuated valves, for example. In an embodiment, valves K may include cartridge valves integrated into cold plate assembly 202 along with portions/segments of conduits C. Conduits $C1_{IN}$ and C1our may be referred to as first inlet and outlet conduits, and conduits $C2_{IN}$ and $C2_{OUT}$ may be referred to as second inlet and outlet conduits. Similarly, valves $K1_{IN}$ and $K1_{OUT}$ may be referred to as first inlet and outlet valves, and valves $K2_{IN}$ and $K2_{OUT}$ may be referred to as second inlet and outlet valves.

To configure conduit switch network 122, controller 126 asserts control signals 128(1), 128(2) of control signals 128 to open (i.e., turn on) and close (i.e., turn off) the valves depending on which mode is active (i.e., depending on the active mode of power circuit 104) to configure the network of conduits to deliver the cold coolant from inlet IN to port P1 or port P2, and to deliver the hot coolant from an alternative one of port P1 or port P2 to outlet OUT, which forms a reversible coolant loop to cool power circuit 104.

That is controller 126 controls valves K to reverse the direction of flow of the cold coolant through coolant conduit 120 depending on the active mode.

Conduit switch network 122 is now described in further detail. Conduit switch network 122 also includes fluid couplers 204, 206, 208, and 210 that serve as fluid splitters or combiners (which may be bi-directional) for conduits C depending on a direction of coolant flow. Fluid coupler 204 includes an input port 204(1) coupled to inlet IN and to parallel output ports 204(2), 204(3) of the fluid coupler. Fluid coupler 206 includes a combined output port 206(1) coupled to outlet OUT and that is fed by parallel input ports 206(2), 206(3) of the fluid coupler. Fluid coupler 208 includes an input/output port 208(1) coupled to port P1 and to parallel output/input ports 208(2), 208(3) of the fluid coupler. Fluid coupler 210 includes an input/output port 210(1) coupled to port P2 and to parallel output/input ports 210(2), 210(3) of the fluid coupler. Conduit $C1_{IN}$ is coupled to ports 204(2), 208(2) through valve $K1_{IN}$, conduit $C1_{OUT}$ is coupled to ports 210(3), 206(3) through valve $K1_{OUT}$, conduit $C2_{IN}$ is coupled to ports 204(3), 210(2) through valve $K2_{IN}$, and conduit $C2_{OUT}$ is coupled to ports 208(3), 206(2).

Valves $K1_{IN}$ and $K1_{OUT}$ are both controlled responsive to control signal 128(1) of control signals 128 generated by controller 126. Control signal 128(1) has a first state/value and a second state/value that opens both valves to permit coolant to flow through the conduits and closes both valves to block the flow of coolant, respectively. Valves $K2_{IN}$ and $K2_{OUT}$ are both controlled responsive to control signal 128(2) of control signals 128 generated by controller 126. Control signal 128(2) has a first state/value and a second state/value that opens both valves to permit coolant to flow through the conduits and closes both valves to block the flow of coolant, respectively.

Figure 3:
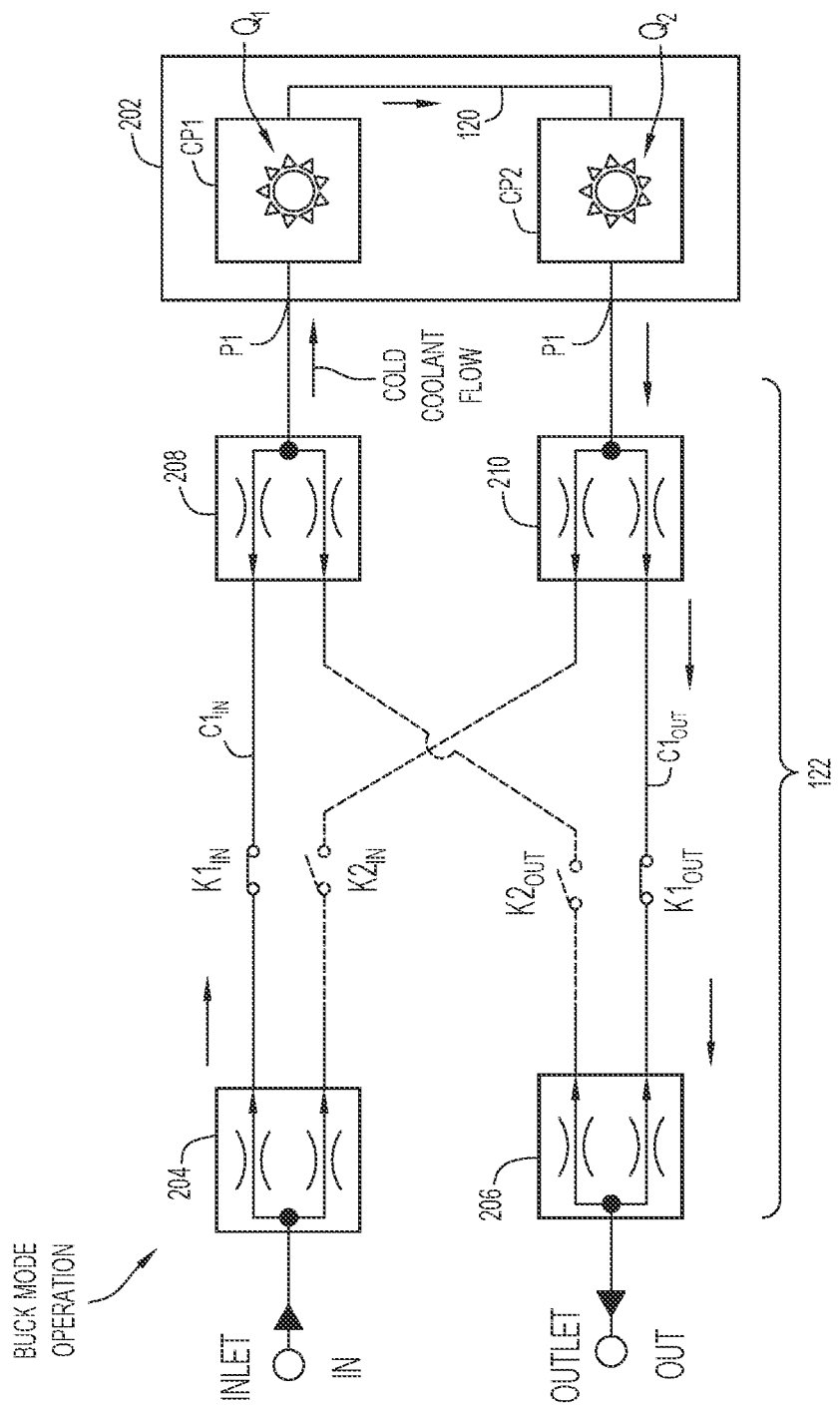
FIG. 3 is an illustration of a conduit switch network of the reversible cooling apparatus configured for Buck mode operation of the power circuit, according to an embodiment.
Figure 4:
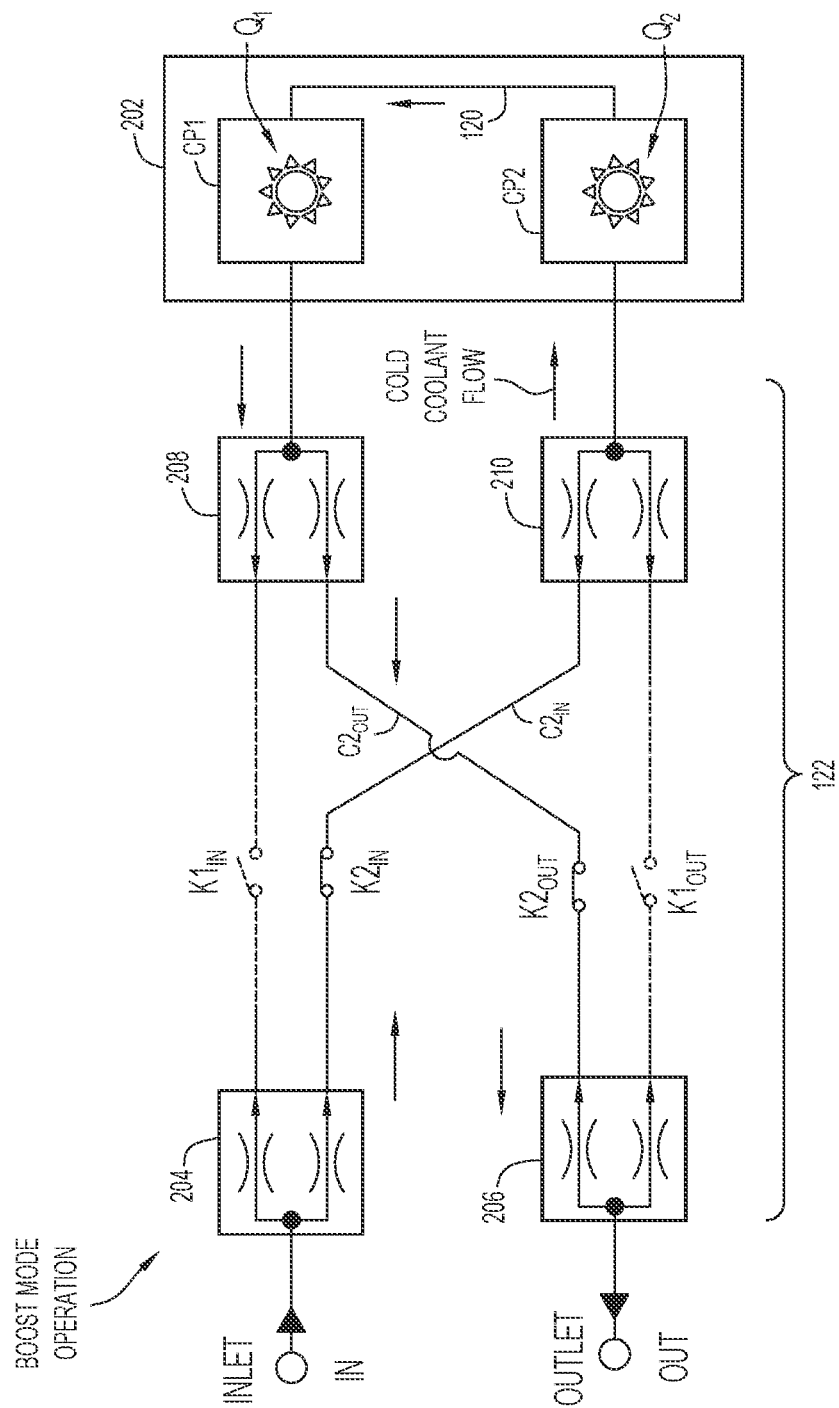
FIG. 4 is an illustration of the conduit switch network configured for Boost mode operation of the power circuit, according to an embodiment.
Figure 5:
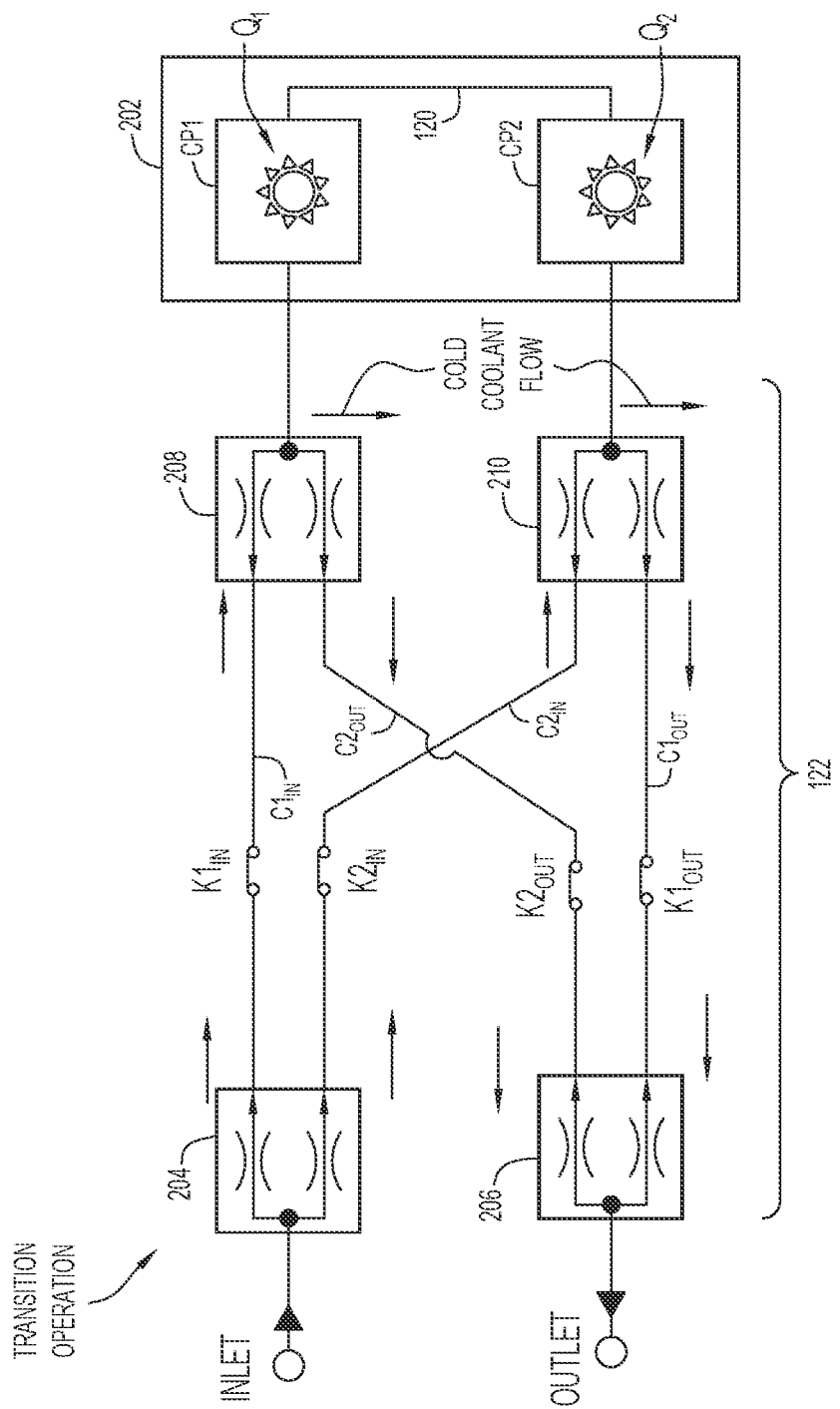
FIG. 5 is an illustration of the conduit switch network configured for a transition between the Buck mode and the Boost mode, according to an embodiment.

FIGS. 3, 4, and 5 are described next. FIGS. 3, 4, and 5 are illustrations of conduit switch network 122 as configured by controller 126 when the Buck mode is active, the Boost mode is active, and when there is a transition between the Buck mode and the Boost mode, respectively. In each case, controller 126 determines the active mode or whether there is a transition, accesses a predetermined valve configuration table having entries that map the active modes and transition state to corresponding valve states for valves K, and sets valves K to the valve states. An example of such a predetermined table is described below in connection with FIG. 6. In FIGS. 3 and 4, coolant flow paths that are not enabled (i.e., are blocked) because their respective valves are open are shown in dashed line.

FIG. 3 is an illustration of conduit switch network 122 configured by controller 126 for Buck mode operation of power circuit 104, i.e., when the Buck mode is active. For clarity, heat exchanger 124, controller 126, control signals 128, and various labels are omitted from FIG. 3. In Buck mode operation, the power loss relationship for Q1, Q2 is $Q1_{LOSS} \gg Q2_{LOSS}$. As shown, valves $K1_{IN}$ and $K1_{OUT}$ are turned on (i.e., closed), and valves $K2_{IN}$ and $K2_{OUT}$ are turned off (i.e., open). Thus, the cold coolant flows from inlet IN to port P1 and Q1 first, then flows to Q2 and port P2 second, and then exits as hot coolant and returns to heat exchanger 124 (not shown) via outlet OUT (i.e., the cold coolant flows from inlet IN to outlet OUT through port P1 and port P2, in that order). Therefore, the cold coolant initially encounters Q1 which dissipates more power than Q2 in the Buck mode, then encounters Q2 which dissipates less power than Q1. The clockwise direction of coolant flow along a Buck-mode coolant loop formed by the valve configuration is shown by arrows in FIG. 3.

FIG. 4 is an illustration of conduit switch network 122 configured by controller 126 for Boost mode operation of power circuit 104, i.e., when the Boost mode is active. In Boost mode operation, the power loss relationship for Q1, Q2 is $Q2_{LOSS} \gg Q1_{LOSS}$. As shown, valves $K1_{IN}$ and $K1_{OUT}$ are turned off, and valves $K2_{IN}$ and $K2_{OUT}$ are turned on. Thus, the cold coolant flows from inlet IN to port P2 and Q2 first, then flows to Q1 and port P1 second, and then exits as hot coolant and returns to heat exchanger 124 via outlet OUT. (i.e., the cold coolant flows from inlet IN to outlet OUT through port P2 and port P1, in that order). Therefore, the cold coolant initially encounters Q2 which dissipates more power than Q1 in the Boost mode, then encounters Q1 which dissipates less power than Q2. The counter-clockwise direction of coolant flow along a Boost-mode coolant loop formed by the valve configuration is shown by arrows.

FIG. 5 is an illustration of conduit switch network 122 configured by controller 126 during a transition between modes, i.e., during the transition between the Buck mode and the Boost mode. During the transition, first, both valves $K1_{IN}$ and $K1_{OUT}$ are turned on, and both valves $K2_{IN}$ and $K2_{OUT}$ are also turned on. The "all-valves on" configuration results in sharing the cold coolant across two bypass loops. That is, conduit switch network 122 is configured to cause the flow of cold coolant to bypass coolant conduit 120 (and Q1, Q2), which reduces by 50% a transient physical impact generated by running cold coolant to Q1, Q2. Second, two of the four valves that are no longer needed are turned off (i.e., opened) to finish the transition.

FIG. 6 is an example table 600 that summarizes the operating modes of power circuit 104, including Buck, Boost, and Transition represented by columns of the table vs. states (on or off) of valves $K1_{IN}$, $K1_{OUT}$, $K2_{IN}$, and $K2_{OUT}$ represented as rows of the table.

Figure 7:
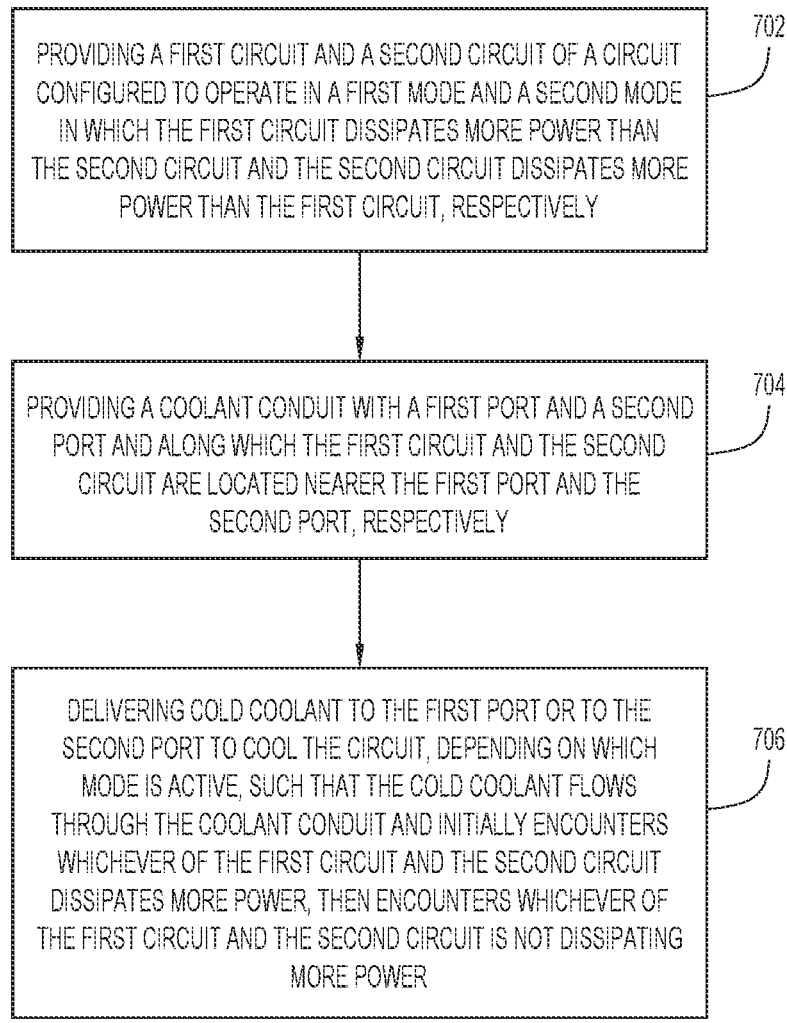
FIG. 7 is a flowchart of an example method performed by the reversible cooling apparatus.

FIG. 7 is a flowchart of an example method 700 performed by reversible cooling apparatus 102 to liquid cool a power circuit.

702 includes providing the power circuit to include a first circuit and a second circuit (e.g., a first switching transistor/circuit and a second switching transistor/circuit). The power circuit is selectively operable in a first mode (e.g., a Buck mode) and a second mode (e.g., a Boost mode) in which the first circuit dissipates more power than the second circuit and the second circuit dissipates more power than the first circuit, respectively.

704 includes providing a coolant conduit with a first port and a second port and along which the first circuit and the second circuit are located nearer the first port and the second port along a flow path of a cold coolant, respectively.

706 includes delivering the cold coolant to the first port or the second port to cool the circuit, depending on which mode is active, such that the cold coolant flows through the coolant conduit and initially encounters whichever of the first circuit and the second circuit dissipates more power, then encounters whichever of the first circuit and the second circuit is not dissipating more power, and then exits the coolant conduit as hot coolant to be cooled for another circulation.

In summary, embodiments presented herein provide a reversible cooling apparatus for a non-isolated bi-directional DC-DC converter. The reversible cooling apparatus ensures that the device of the DC-DC converter that has the highest power dissipation is targeted with the coldest coolant, while the device with the lower power loss is targeted with coolant at a higher temperature. As a result, the devices have a more balanced junction temperature, and maximum junction temperature is reduced, which improves DC-DC converter reliability, reduces power losses, and allows a higher output power level with the same cooling. The reversible cooling apparatus includes "all-on" transition control to reduce the physical impact from the running coolant by 50%. The reversible cooling apparatus avoids added sensors and avoids complexity required for pump/fan speed control. The reversible cooling apparatus reduces mechanical cold plate complexity required for active flow control and can be implemented in a normal liquid-cooled cold plate with external solenoid valves. The reversible cooling apparatus can be used in cooling systems with two cooling cells, which have variable and dynamic dissipation ratios.

Figure 8:
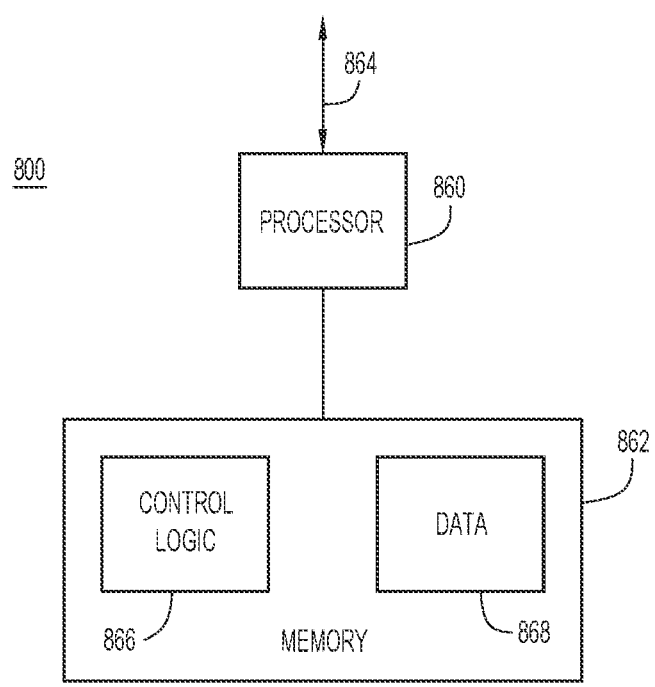
FIG. 8 is a block diagram of an example controller configured to perform operations described herein.

FIG. 8 is a block diagram of an example controller 800 configured to perform operations described herein. Controller 800 may represent PC controller 105 and/or controller 126. Controller 800 includes processor(s) 860 and a memory 862 coupled to one another. The aforementioned components may be implemented in hardware (e.g., a hardware processor), software (e.g., a software processor), or a combination thereof. Processor(s) 860 communicate with other entities/processes over hardware and/or software interfaces 864, e.g., to provide switching signals to switching transistors and valve control signals to valves, and to communicate with other processors, for example. Memory 862 stores control software 866 (referred as "control logic"), that when executed by the processor(s) 860, causes the processor(s), and more generally, controller 800, to perform the various operations described herein. The processor(s) 860 may be a microprocessor or microcontroller (or multiple instances of such components). The memory 862 may include read only memory (ROM), random access memory (RAM), magnetic disk storage media devices, optical storage media devices, flash memory devices, electrical, optical, or other physically tangible (i.e., non-transitory) memory storage devices. Controller 800 may also be discrete logic embedded within an integrated circuit (IC) device.

Thus, in general, the memory 862 may comprise one or more tangible (non-transitory) computer readable storage media (e.g., memory device(s)) including a first non-transitory computer readable storage medium, a second non-transitory computer readable storage medium, and so on, encoded with software or firmware that comprises computer executable instructions. For example, control software 866 includes logic to implement operations performed by the controller 800. Thus, control software 866 implements the various methods/operations described herein.

In addition, memory 862 stores data 868 used and produced by control software 866.

In summary, in some aspects, the techniques described herein relate to an apparatus including: a first circuit and a second circuit of a circuit configured to operate in a first mode and a second mode in which the first circuit dissipates more power than the second circuit and the second circuit dissipates more power than the first circuit, respectively; a coolant conduit along which the first circuit and the second circuit are thermally coupled at spaced-apart locations; and a conduit switch network configured to deliver cold coolant to the coolant conduit to cool the circuit, depending on which mode is active, such that the cold coolant flows through the coolant conduit and initially encounters whichever of the first circuit and the second circuit dissipates more power, then encounters whichever of the first circuit and the second circuit is not dissipating more power.

In some aspects, the techniques described herein relate to an apparatus, further including: a heat exchanger coupled to the conduit switch network, wherein the conduit switch network delivers hot coolant exiting the coolant conduit to the heat exchanger and the heat exchanger converts the hot coolant to the cold coolant.

In some aspects, the techniques described herein relate to an apparatus, wherein the conduit switch network is configured to: when the first mode is active, deliver the cold coolant to the coolant conduit such that the cold coolant initially encounters the first circuit first and then encounters the second circuit; and when the second mode is active, deliver the cold coolant to coolant conduit such that the cold coolant initially encounters the second circuit and then encounters the first circuit.

In some aspects, the techniques described herein relate to an apparatus, wherein: when there is a transition between the first mode and the second mode, the conduit switch network is further configured to cause the cold coolant to bypass the coolant conduit.

In some aspects, the techniques described herein relate to an apparatus, wherein: the coolant conduit includes a first port and a second port and the first circuit and the second circuit are located nearer the first port and the second port along a flow path of the cold coolant, respectively; and the conduit switch network is configured to deliver the cold coolant to the first port or the second port to cool the circuit, depending on which mode is active, such that the cold coolant flows through the coolant conduit and initially encounters whichever of the first circuit and the second circuit dissipates more power, then encounters whichever of the first circuit and the second circuit is not dissipating more power, and then exits the coolant conduit as hot coolant.

In some aspects, the techniques described herein relate to an apparatus, wherein the conduit switch network includes: an inlet for the cold coolant and an outlet for the hot coolant; a network of conduits configured to selectively connect the inlet and the outlet to the first port and the second port through valves coupled to respective ones of the conduits; and a controller to open and close the valves depending on which mode is active to configure the network of conduits to deliver the cold coolant from the inlet to the first port or the second port, and to deliver the hot coolant from an alternative one of the first port or the second port to the outlet, to form a coolant loop to cool the circuit.

In some aspects, the techniques described herein relate to an apparatus, wherein the controller is configured to open and close the valves depending on which mode is active to configure the network of conduits to: when the first mode is active, cause the cold coolant to flow from the inlet to the outlet through the first port and the second port in order; and when the second mode is active, cause the cold coolant to flow from the inlet to the outlet through the second port and the first port in that order.

In some aspects, the techniques described herein relate to an apparatus, wherein the controller is configured to control which mode is active.

In some aspects, the techniques described herein relate to an apparatus, further including: a heat exchanger to receive the hot coolant from the outlet, convert the hot coolant to the cold coolant, and return the cold coolant to the inlet.

In some aspects, the techniques described herein relate to an apparatus, further including: a cold plate assembly including the first port and the second port and through which the coolant conduit flows from the first port to the second port, wherein the first circuit and the second circuit are mounted to the cold plate assembly.

In some aspects, the techniques described herein relate to an apparatus, wherein the conduit switch network includes: an inlet for the cold coolant and an outlet for the hot coolant;

first inlet and outlet conduits having first inlet and outlet valves to selectively connect the inlet to the first port and selectively connect the second port to the outlet, respectively; and second inlet and outlet conduits having second inlet and outlet valves to selectively connect the inlet to the second port and selectively connect the first port to the outlet, respectively.

In some aspects, the techniques described herein relate to an apparatus, wherein the conduit switch network is configured to: when the first mode is active, open both the first inlet and outlet valves and close both the second inlet and outlet valves, such that the cold coolant flows from the first port to the second port.

In some aspects, the techniques described herein relate to an apparatus, wherein the conduit switch network is configured to: when the second mode is active, close both the first inlet and outlet valves and open both the second inlet and outlet valves, such that the cold coolant flows from the second port to the first port.

In some aspects, the techniques described herein relate to an apparatus, wherein the conduit switch network is configured to: upon a transition between the first mode and the second mode, close both the first inlet and outlet valves and close both the second inlet and outlet valves so that the cold coolant does not flow through the coolant conduit.

In some aspects, the techniques described herein relate to an apparatus, further including: a heat exchanger to convert hot coolant exiting the coolant conduit to the cold coolant and deliver the cold coolant to the conduit switch network for deliver to the coolant conduit.

In some aspects, the techniques described herein relate to a method including: providing a first circuit and a second circuit of a circuit configured to operate in a first mode and a second mode in which the first circuit dissipates more power than the second circuit and the second circuit dissipates more power than the first circuit, respectively; providing a coolant conduit with a first port and a second port and along which the first circuit and the second circuit are located near the first port and the second port, respectively; and delivering cold coolant to the first port or the second port to cool the circuit, depending on which mode is active, such that the cold coolant flows through the coolant conduit to initially encounter whichever of the first circuit and the second circuit dissipates more power, then encounter whichever of the first circuit and the second circuit is not dissipating more power, and then exit the coolant conduit as hot coolant.

In some aspects, the techniques described herein relate to a method, wherein delivering the cold coolant includes: delivering the cold coolant to the first port when the first mode is active such that the cold coolant initially encounters the first circuit first and then encounters the second circuit; and delivering the cold coolant to the second port when the second mode is active such that the cold coolant initially encounters the second circuit and then encounters the first circuit.

In some aspects, the techniques described herein relate to a method, further including: when there is a transition between the first mode and the second mode, causing the cold coolant to bypass the coolant conduit.

In some aspects, the techniques described herein relate to a method, further including: providing an inlet for the cold coolant and an outlet for the hot coolant; providing a network of conduits configured to selectively connect the inlet and the outlet to the first port and the second port through valves coupled to respective ones of the conduits; and opening and closing the valves depending on which mode is active to configure the network of conduits to deliver the cold coolant from the inlet to the first port or the second port, and to deliver the hot coolant from an alternative one of the first port or the second port to the outlet, to form a coolant loop to cool the circuit.

In some aspects, the techniques described herein relate to a method, wherein opening and closing the valves depending on which mode is active includes opening and closing the valves to: when the first mode is active, cause the cold coolant to flow from the inlet to the outlet through the first port and the second port in order; and when the second mode is active, cause the cold coolant to flow from the inlet to the outlet through the second port and the first port in order.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. An apparatus comprising:
   a first circuit and a second circuit of a circuit configured to operate in a first mode and a second mode in which the first circuit dissipates more power than the second circuit and the second circuit dissipates more power than the first circuit, respectively;
   a coolant conduit along which the first circuit and the second circuit are thermally coupled at spaced-apart locations; and
   a conduit switch network configured to deliver cold coolant to the coolant conduit to cool the circuit, depending on which mode is active, such that the cold coolant flows through the coolant conduit and initially encounters whichever of the first circuit and the second circuit dissipates more power, then encounters whichever of the first circuit and the second circuit is not dissipating more power.

2. The apparatus of claim 1, further comprising:
   a heat exchanger coupled to the conduit switch network,
   wherein the conduit switch network delivers hot coolant exiting the coolant conduit to the heat exchanger and the heat exchanger converts the hot coolant to the cold coolant.

3. The apparatus of claim 1, wherein the conduit switch network is configured to:
   when the first mode is active, deliver the cold coolant to the coolant conduit such that the cold coolant initially encounters the first circuit first and then encounters the second circuit; and
   when the second mode is active, deliver the cold coolant to coolant conduit such that the cold coolant initially encounters the second circuit and then encounters the first circuit.

4. The apparatus of claim 3, wherein:
   when there is a transition between the first mode and the second mode, the conduit switch network is further configured to cause the cold coolant to bypass the coolant conduit.

5. The apparatus of claim 1, wherein:
   the coolant conduit includes a first port and a second port and the first circuit and the second circuit are located nearer the first port and the second port along a flow path of the cold coolant, respectively; and
   the conduit switch network is configured to deliver the cold coolant to the first port or the second port to cool the circuit, depending on which mode is active, such that the cold coolant flows through the coolant conduit and initially encounters whichever of the first circuit and the second circuit dissipates more power, then encounters whichever of the first circuit and the second circuit is not dissipating more power, and then exits the coolant conduit as hot coolant.

6. The apparatus of claim 5, wherein the conduit switch network includes:
an inlet for the cold coolant and an outlet for the hot coolant;
a network of conduits configured to selectively connect the inlet and the outlet to the first port and the second port through valves coupled to respective ones of the conduits; and
a controller to open and close the valves depending on which mode is active to configure the network of conduits to deliver the cold coolant from the inlet to the first port or the second port, and to deliver the hot coolant from an alternative one of the first port or the second port to the outlet, to form a coolant loop to cool the circuit.

7. The apparatus of claim 6, wherein the controller is configured to open and close the valves depending on which mode is active to configure the network of conduits to:
when the first mode is active, cause the cold coolant to flow from the inlet to the outlet through the first port and the second port in order; and
when the second mode is active, cause the cold coolant to flow from the inlet to the outlet through the second port and the first port in that order.

8. The apparatus of claim 6, wherein the controller is configured to control which mode is active.

9. The apparatus of claim 6, further comprising:
a heat exchanger to receive the hot coolant from the outlet, convert the hot coolant to the cold coolant, and return the cold coolant to the inlet.

10. The apparatus of claim 5, further comprising:
a cold plate assembly including the first port and the second port and through which the coolant conduit flows from the first port to the second port, wherein the first circuit and the second circuit are mounted to the cold plate assembly.

11. The apparatus of claim 5, wherein the conduit switch network includes:
an inlet for the cold coolant and an outlet for the hot coolant;
first inlet and outlet conduits having first inlet and outlet valves to selectively connect the inlet to the first port and selectively connect the second port to the outlet, respectively; and
second inlet and outlet conduits having second inlet and outlet valves to selectively connect the inlet to the second port and selectively connect the first port to the outlet, respectively.

12. The apparatus of claim 11, wherein the conduit switch network is configured to:
when the first mode is active, open both the first inlet and outlet valves and close both the second inlet and outlet valves, such that the cold coolant flows from the first port to the second port.

13. The apparatus of claim 12, wherein the conduit switch network is configured to:
when the second mode is active, close both the first inlet and outlet valves and open both the second inlet and outlet valves, such that the cold coolant flows from the second port to the first port.

14. The apparatus of claim 12, wherein the conduit switch network is configured to:
upon a transition between the first mode and the second mode, close both the first inlet and outlet valves and close both the second inlet and outlet valves so that the cold coolant does not flow through the coolant conduit.

15. The apparatus of claim 1, further comprising:
a heat exchanger to convert hot coolant exiting the coolant conduit to the cold coolant and deliver the cold coolant to the conduit switch network for deliver to the coolant conduit.

16. A method comprising:
providing a first circuit and a second circuit of a circuit configured to operate in a first mode and a second mode in which the first circuit dissipates more power than the second circuit and the second circuit dissipates more power than the first circuit, respectively;
providing a coolant conduit with a first port and a second port and along which the first circuit and the second circuit are located near the first port and the second port, respectively; and
delivering cold coolant to the first port or the second port to cool the circuit, depending on which mode is active, such that the cold coolant flows through the coolant conduit to initially encounter whichever of the first circuit and the second circuit dissipates more power, then encounter whichever of the first circuit and the second circuit is not dissipating more power, and then exit the coolant conduit as hot coolant.

17. The method of claim 16, wherein delivering the cold coolant includes:
delivering the cold coolant to the first port when the first mode is active such that the cold coolant initially encounters the first circuit first and then encounters the second circuit; and
delivering the cold coolant to the second port when the second mode is active such that the cold coolant initially encounters the second circuit and then encounters the first circuit.

18. The method of claim 16, further comprising:
when there is a transition between the first mode and the second mode, causing the cold coolant to bypass the coolant conduit.

19. The method of claim 16, further comprising:
providing an inlet for the cold coolant and an outlet for the hot coolant;
providing a network of conduits configured to selectively connect the inlet and the outlet to the first port and the second port through valves coupled to respective ones of the conduits; and
opening and closing the valves depending on which mode is active to configure the network of conduits to deliver the cold coolant from the inlet to the first port or the second port, and to deliver the hot coolant from an alternative one of the first port or the second port to the outlet, to form a coolant loop to cool the circuit.

20. The method of claim 19, wherein opening and closing the valves depending on which mode is active includes opening and closing the valves to:
when the first mode is active, cause the cold coolant to flow from the inlet to the outlet through the first port and the second port in order; and
when the second mode is active, cause the cold coolant to flow from the inlet to the outlet through the second port and the first port in order.

* * * * *